(12) United States Patent
Boyd et al.

(10) Patent No.: US 7,596,886 B1
(45) Date of Patent: Oct. 6, 2009

(54) METHOD AND SYSTEM TO SEPARATE AND RECYCLE DIVERGENT CHEMISTRIES

(75) Inventors: John M. Boyd, Atascadero, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 889 days.

(21) Appl. No.: 10/325,556

(22) Filed: Dec. 18, 2002

(51) Int. Cl.
*F26B 17/24* (2006.01)
*B08B 3/04* (2006.01)

(52) U.S. Cl. .............. 34/317; 34/339; 34/357; 34/58; 134/148; 134/153; 134/186; 134/902

(58) Field of Classification Search .......... 34/317, 34/58, 337, 339, 342, 357; 134/902, 186, 134/148, 153
See application file for complete search history.

(56) References Cited

U.S. PATENT DOCUMENTS

| | | | |
|---|---|---|---|
| 4,087,924 A | * | 5/1978 | Fujimoro et al. ............ 34/58 |
| 4,517,752 A | * | 5/1985 | Devico et al. ............... 34/58 |
| 5,288,333 A | * | 2/1994 | Tanaka et al. .............. 134/31 |
| 6,179,982 B1 | * | 1/2001 | Ting et al. .................. 205/80 |
| 6,214,193 B1 | * | 4/2001 | Reid et al. ............... 205/122 |
| 6,239,038 B1 | * | 5/2001 | Wen ....................... 438/745 |
| 6,332,723 B1 | * | 12/2001 | Matsuyama et al. ....... 134/902 |

* cited by examiner

*Primary Examiner*—Jiping Lu
(74) *Attorney, Agent, or Firm*—Martine Penilla & Gencarella, LLP

(57) ABSTRACT

In one embodiment of the invention, an apparatus for collecting fluid within a wafer cleaning chamber is provided. The apparatus includes a rotatable annular manifold configured to support a wafer within an inner cavity defined by an inner surface of the annular manifold. The annular manifold includes a channel extending from an inner surface of the annular manifold to a floor of the annular manifold. The floor has at least one opening. The apparatus includes a catch basin having a base with at least one drain. The base has an inner sidewall and an outer sidewall extending therefrom. The catch basin is disposed under the annular manifold to capture fluid dispensed from the at least one opening of the floor of the annular manifold. A spin, rinse and dry module and a method for collecting a fluid delivered to the surface of a rotating wafer are provided.

25 Claims, 7 Drawing Sheets

METHOD AND SYSTEM TO SEPARATE AND RECYCLE DIVERGENT CHEMISTRIES

BACKGROUND OF THE INVENTION

The present invention relates to semiconductor fabrication and, more particularly, to methods and systems for collecting divergent chemistries in a wafer cleaning chamber.

In the fabrication of semiconductor devices, wafers are cleaned in wafer cleaning chambers, such as spin, rinse and dry modules. For a single wafer cleaning operation, it is well known to those skilled in the art, that various cleaning chemistries are applied to a wafer in order to clean the wafer following a previous processing operation. FIG. 1 is a simplified schematic diagram of a conventional single-wafer cleaning chamber also known as a spin, rinse and dry module. As shown in FIG. 1, wafer 104 is supported in a cleaning chamber 102. Wafer 104 is rotating around axis 110 in direction 106. While wafer 104 is rotating, fluid (i.e., cleaning chemistry) is applied to the top surface of the wafer. As the fluid is spun-off of the top surface of wafer 104, the walls and the bottom portions of cleaning chamber 102 become coated with the fluid due to spray-off during wafer rotation.

The fluid falling to the floor of cleaning chamber 102 is collected through drain 112. Once a first fluid has been applied to wafer 104, the cleaning chamber 102 is rinsed in preparation for application of a second fluid. Each fluid and subsequent rinsing agent is received by drain 112 and then either sent to a location to be disposed of or to be recycled. Since a single drain 112 collects the effluent, separation and collection of the chemical waste streams becomes difficult.

Another shortcoming of the system described with reference to FIG. 1, is that the cleaning chemistry is spread over a large inner surface area of the cleaning chamber. Thus, some of the fluid may not be successfully reclaimed. That is, where a first cleaning chemistry is followed by a second cleaning chemistry, the second cleaning chemistry may not be able to be recycled. The lack of ability to recycle the second cleaning chemistry may be due to the excessive time to obtain a pure chemical stream that is not diluted by the remaining residues of the first cleaning chemistry or any rinsing agent. This loss can be problematic when expensive cleaning chemistries are used. Additionally, the rinsing of the cleaning chamber between different cleaning chemistry applications requires extra processing time, in addition to a large amount of rinsing agent, to thoroughly remove any of the previous cleaning chemistry from the inside surface of the cleaning chamber. Therefore, rinsing the chemical effluent remaining in the cleaning chamber adds to the time and cost of wafer cleaning operations. Consequently, current cleaning chamber designs are inadequate to capture effluent efficiently for recycling or waste treatment.

In view of the foregoing, there is a need for a process to increase the efficiency of chemistry collection and rinsing in wafer cleaning chambers.

SUMMARY OF THE INVENTION

Broadly speaking, the present invention fills these needs by providing an apparatus, system and a method for collecting fluids delivered to the surface of a rotating wafer. It should be appreciated that the present invention can be implemented in numerous ways, including as a process, a system, or a device. Several inventive embodiments of the present invention are described below.

In one embodiment of the invention, an apparatus for collecting fluid within a wafer cleaning chamber is provided. The apparatus includes a rotatable annular manifold configured to support a wafer within an inner cavity defined by an inner surface of the annular manifold. The annular manifold includes a channel extending from an inner surface of the annular manifold to a floor of the annular manifold. The floor of the annular manifold has at least one opening defined therein. The apparatus also includes a catch basin having a base with at least one drain defined therein. The base of the catch basin has an inner sidewall and an outer sidewall extending from the base. The catch basin is disposed under the annular manifold so as to capture fluid dispensed from at least one opening of the floor of the annular manifold.

In another embodiment of the invention, a spin, rinse and dry module is provided. The spin rinse and dry module includes an annular manifold for rotating a wafer disposed within an inner cavity defined by an inner surface of the annular manifold. The annular manifold has a channel defined therein for collecting a fluid dispersed from a surface of the rotating wafer. A catch basin is included. The catch basin is disposed under the annular manifold and is configured to receive the fluid from a channel opening of the annular manifold. A drive mechanism for rotating the annular manifold is also provided.

In yet another embodiment of the invention, a method for collecting a fluid delivered to a surface of a rotating wafer is provided. The method initiates with disposing a wafer within a cavity defined by an inner surface of an annular manifold. The wafer is rotated and then a fluid is delivered to a surface of the rotating wafer. The fluid spun from the surface of the rotating wafer is channeled through the annular manifold to a catch basin. The fluid from the catch basin is dispensed to a collection tank.

In still yet another embodiment, a method for collecting fluids delivered to a surface of a rotating wafer is provided. The method initiates with disposing a wafer within a cavity defined by an inner surface of an annular manifold. The wafer is rotated and a first fluid is delivered to a surface of the rotating wafer. The first fluid spun from the surface of the rotating wafer is channeled through the annular manifold to a catch basin. The first fluid is controllably dispensed from the catch basin to a first collection tank. Then, a second fluid is delivered to a surface of the rotating wafer. The second fluid spun from the surface of the rotating wafer is channeled through the annular manifold to the catch basin. The second fluid is controllably dispensed from the catch basin to a second collection tank. Here, the first fluid may be delivered to a top surface of the wafer while the second fluid is delivered to the bottom surface of the wafer.

It is to be understood that the foregoing general description and the following detailed description are exemplary and explanatory only, and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1:
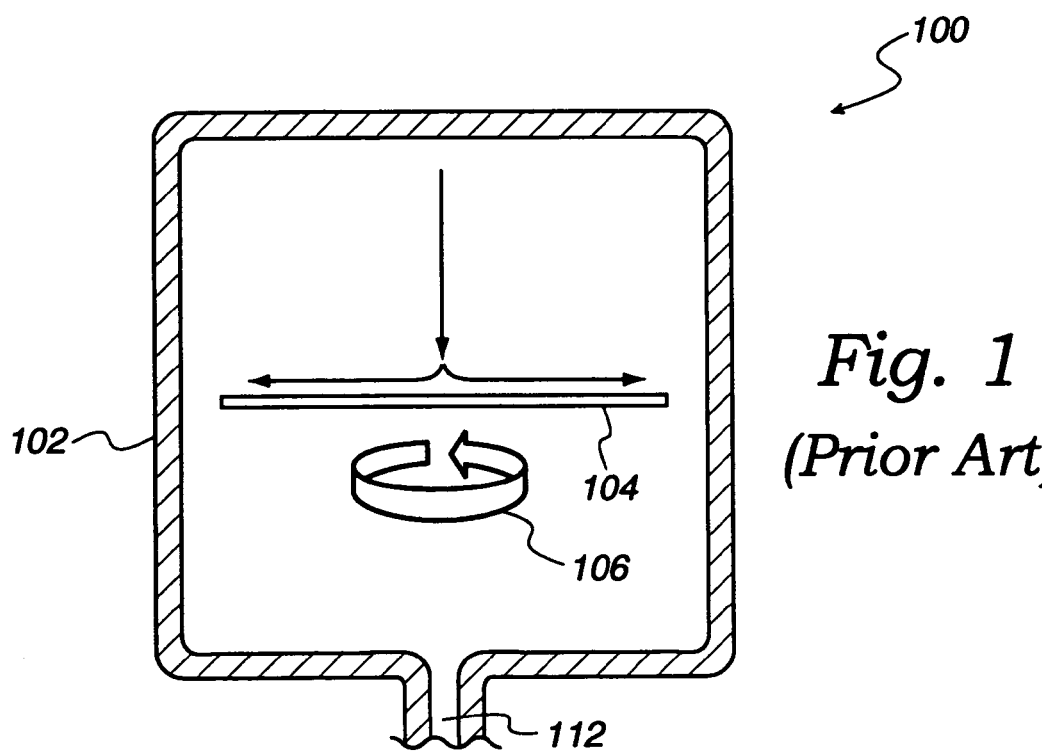
FIG. 1 is a simplified schematic diagram of a conventional single-wafer cleaning chamber also known as a spin, rinse and dry module.

Several exemplary embodiments of the invention will now be described in detail with reference to the accompanying drawings. FIG. 1 has been described above in the "Background of the Invention" section.

The embodiments described herein provide for a method, apparatus and system for efficiently collecting a fluid from a wafer during a cleaning or rinsing operation. As a wafer rotates, fluid is applied to a surface of the wafer. The fluid is spun-off the surface of the wafer and captured by an annular manifold. The fluid is then directed to a drain, which in turn sends the fluid to an appropriate collection tank. The annular manifold capturing the fluid from the rotating wafer defines a pathway that has a relatively small surface area as compared to the surface area of the inner surfaces of the cleaning chamber. Thus, the amount of surface area required to be flushed between different fluid applications (divergent chemistries) to the wafer surface is substantially reduced. Consequently, the processing time is reduced for the single wafer cleaning operation, thereby increasing throughput. Additionally, the loss of cleaning chemistry is reduced since a second cleaning chemistry may be reclaimed more quickly after the application of a first cleaning chemistry, as will be explained in more detail below.

Figure 2:
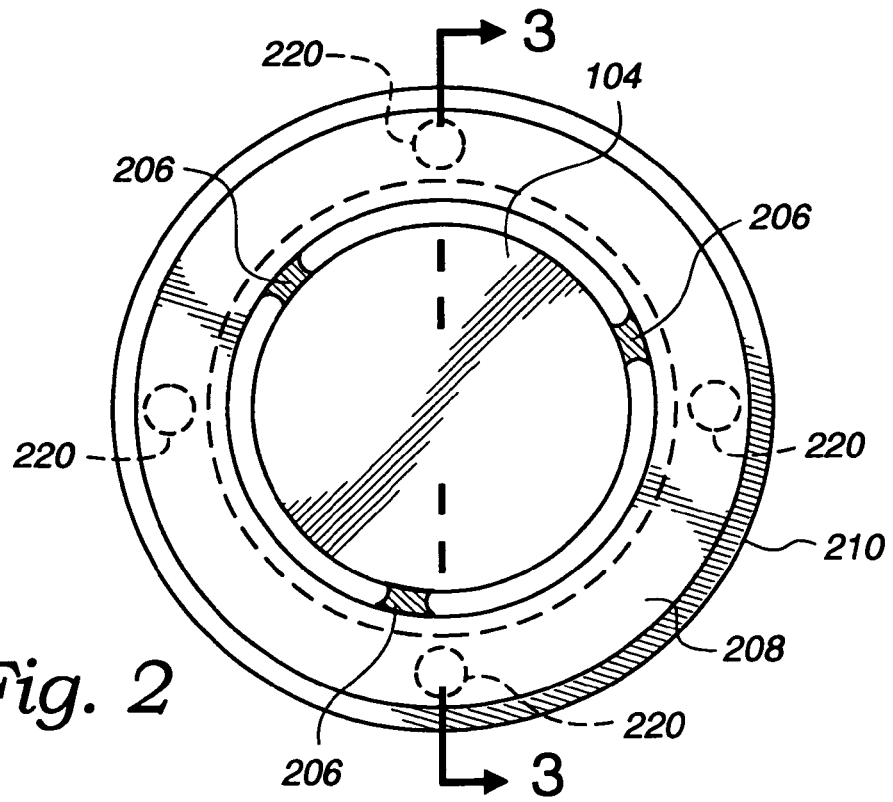
FIG. 2 is a simplified top view of a fluid collection device in accordance with one embodiment of the invention.

FIG. 2 is a simplified top view of a fluid collection device in accordance with one embodiment of the invention. As shown therein, wafer 104 is supported by clamps 206 inside an inner cavity of annular manifold 208. Clamps 206 are affixed to an inner edge of annular manifold 208. It will be apparent to one skilled in the art that clamps 206 may have any configuration suitable for supporting wafer 104, such as fingers, flexible supports, pads, etc., that may accept the wafer from known robotic delivery systems and release the wafer to known robotic removal systems. Of course, clamps 206 are configured to provide a degree of adjustability sufficient to accommodate the placement and removal of wafers. The number of clamps 206 and the location of the clamps may be varied to suit the needs of particular applications. Annular manifold 208 is configured to rotate, therefore, wafer 104 will likewise rotate as the wafer is coupled to the annular manifold through clamps 206.

A channel is defined within annular manifold 208 as will be described further with reference to FIG. 3. Openings 220 are defined in the base of annular manifold 208. It should be appreciated that the base of annular manifold may also be referred to as a floor of the annular manifold. Openings 220 can be holes, nozzles, slots, or any other appropriate structure providing an exit for fluid captured by annular manifold 208. It should be appreciated that the number and the size of openings 220 may be varied to suit the needs of particular applications. That is, the size, shape, and location of openings 220 would be dependent upon the flow requirements. In one embodiment, annular manifold 208 is provided with four openings 220 substantially evenly spaced around annular manifold 208. It should be appreciated that annular manifold 208 may be made of any suitable material compatible with semiconductor processing operations, e.g., steel coated or Teflon coated machinable plastic. Additional details regarding the function and structure of the annular manifold 208 are set forth below with reference to FIG. 3.

Annular manifold 208 is disposed over catch basin 210. Catch basin 210 is configured to capture fluid from the channel of annular manifold 208. Catch basin 210 may be composed of Teflon-coated steel or Teflon coated machinable plastic or other suitable material having sufficient chemical resistance and suitable mechanical properties. It should be appreciated that catch basin 210 is stationary, while annular manifold 208 rotates above the catch basin.

Figure 3:
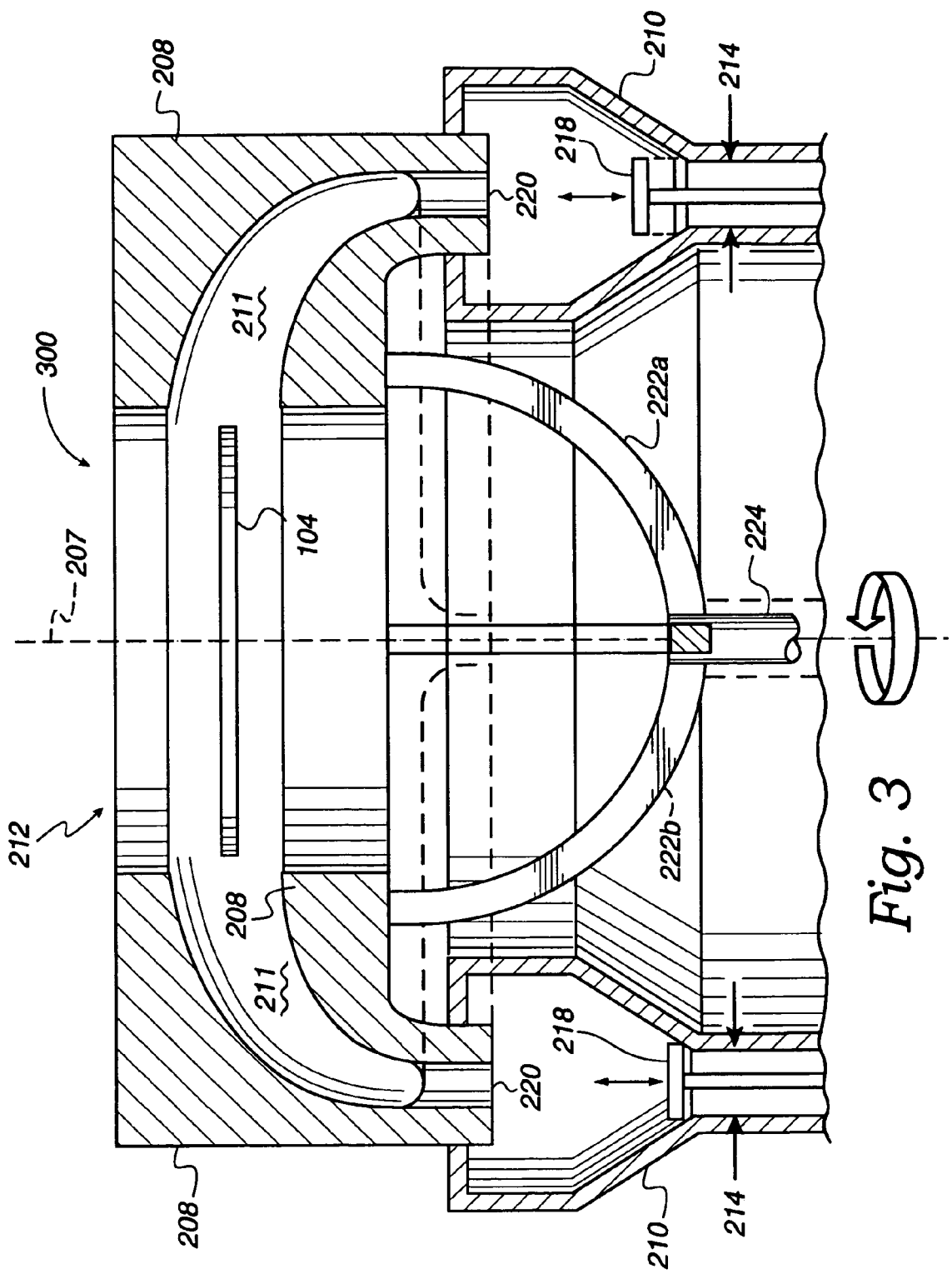
FIG. 3 is a simplified cross-sectional view of the fluid collection device illustrated in FIG. 2.

FIG. 3 is a simplified cross-sectional view of the fluid collection device illustrated in FIG. 2. As shown therein, wafer 104 is disposed in inner cavity 212 and is affixed to annular manifold 208 by clamps 206 (See FIG. 2). Annular manifold 208 includes channel 211. Channel 211 defines an opening extending along an inner edge of the annular manifold 208 and down to a base of the annular manifold. In other words, the opening of channel 211 is defined along a perimeter of inner cavity 212. Openings 220 defined in the base of annular manifold 208 enable fluid flow from channel 211 to catch basin 210. In one embodiment, the base of the annular manifold 208 may be sloped to direct fluid to openings 220.

Continuing with FIG. 3, annular manifold 208 and wafer 104 rotate about axis 207. As annular manifold 208 and wafer 104 are rotating, fluid is applied to the top surface of the wafer. The centrifugal force from the rotation causes the fluid to be forced off of wafer 104 into an opening of channel 211, which is proximate to and surrounds the wafer. The collected fluid is then directed down channel 211 and out of openings 220 into catch basin 210. It should be appreciated that most of the fluid should be captured in channel 211 of annular manifold 208 due to its proximity to the outer edge of wafer 104.

Another feature of the design of FIG. 3 is that since the fluid is basically being collected as it is leaving wafer 104, the flow of fluid from the top surface of the wafer is collected with minimal splash back. Additionally, the fluid on the top surface of wafer 104 is prevented from migrating to the bottom surface of the wafer due to the rotational speed of the wafer. The minimal splash back and prevention of migration would be true for a fluid suitably applied to the bottom surface of wafer 104. For example, a fluid applied to the bottom surface of wafer 104 via a fan spray would be substantially collected through annular manifold 208. Consequently, it is possible to run divergent chemistries on opposite sides of wafer 104 simultaneously. For example, one fluid would be applied to a top surface of wafer 104 while a different fluid would simultaneously be applied to the bottom surface of the wafer, without the concern of the top fluid migrating to the bottom surface and/or the bottom fluid migrating to the top surface. Therefore, a complex cleaning chemistry may be used for the top surface, while a more aggressive and general cleaning agent may be used for the bottom surface of wafer 104. Of course, the cleaning chemistries would not be able to be reclaimed for reuse here, since the cleaning chemistries are mixed in the annular manifold. However, In the case of collection for reuse, the cleaning chemistries may be applied in a serial fashion, with an intermediate rinse step between the applications.

Continuing with the description of FIG. 3, the base of annular manifold 208 includes openings 220 to facilitate flow out of the annular manifold into catch basin 210. It will be apparent to one skilled in the art that openings 220 may be any suitable shape capable of accommodating the flow rate of fluid being captured by annular manifold 208. For example, openings 220 may be one or more circular openings or one or more slots defined through the base of annular manifold 208. Catch basin 210 receives the fluid delivered from annular manifold 208. Catch basin 210 has drain openings 214 defined through the bottom surface of the catch basin. In one embodiment, access to drain openings 214 is controlled through servomotors. The servomotors are configured to move drain plugs 218 in an up and down direction to open and close drain openings 214.

For exemplary purposes, one of the two drain plugs 218 shown in the cross-sectional view of FIG. 3 is in an open position and the other drain plug is in a closed position. It should be appreciated that drain openings 214 are suitably sized to handle the amount liquid received into catch basin 210. Annular manifold 208 is supported by support arms 222a and 222b. Support arms 222a and 222b are affixed at a first end to annular manifold 208 and at a second end to shaft 224. Shaft 224 is coupled to a motor providing the drive mechanism for the rotational force in one embodiment. It should be appreciated that the cross sectional view of FIG. 3 illustrates two support arms, however, four support arms would be preferable to provide added stability for annular manifold 208.

Figure 4:
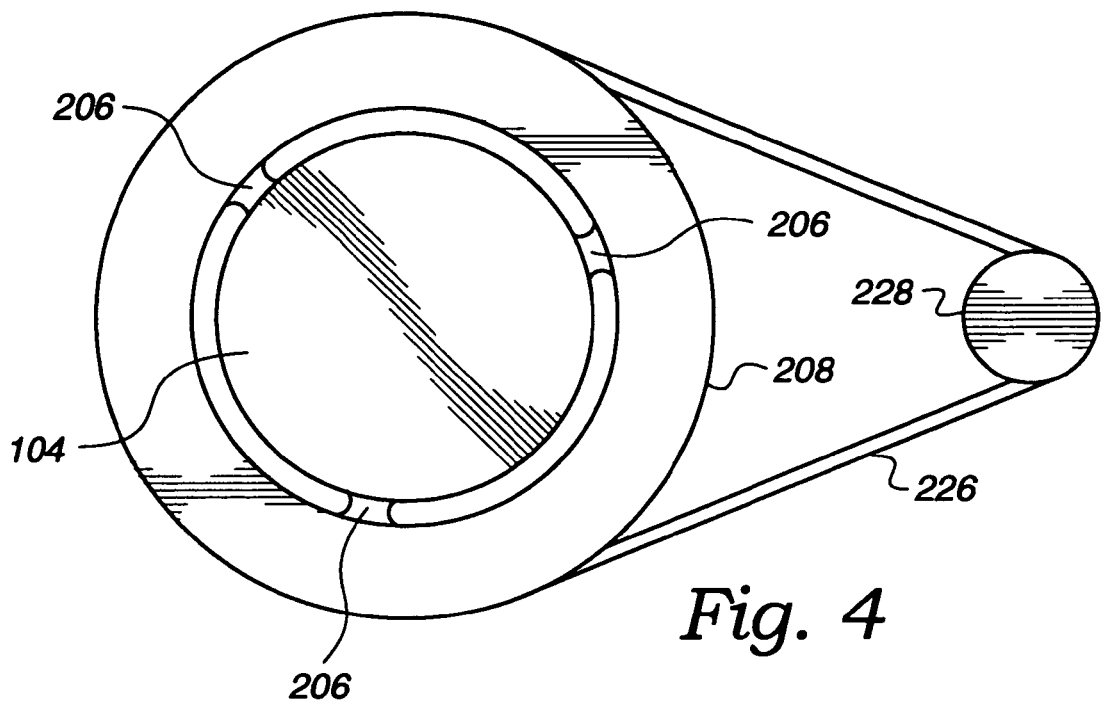
FIG. 4 is a simplified top view of an annular manifold, which is rotated by a belt drive, in accordance with one embodiment of the invention.

FIG. 4 is a simplified top view of an annular manifold, which is rotated by a belt drive, in accordance with one embodiment of the invention. Wafer 104 is coupled to annular manifold 208 with clamps 206. Belt 226 is driven by shaft 228 and in turn, rotates annular manifold 208. A motor (See FIG. 10) provides the power required to rotate shaft 228. Further details of the belt drive system are provided with reference to FIG. 10. It should be appreciated that the configuration of FIG. 4 enables access to the top and bottom surfaces of wafer 104 for assemblies such as, process arm sweep mechanisms, brush rollers, etc. In order to provide structural support for annular manifold 208 in this embodiment, the annular manifold may be encapsulated with a suitable housing as discussed with reference to FIG. 10. The casing would allow annular manifold 208 to rotate while providing support for the annular manifold over the catch basin. One skilled in the art will appreciate that other suitable support structures may be employed. Additionally, alternative drive mechanisms may be used to provide the rotational force beside the drive mechanisms illustrated with reference to FIGS. 3 and 4. For example, a magnetic-bearing drive mechanism may be used to provide the rotational force for annular manifold 208, using an annular linear motor assembly.

Figure 5:
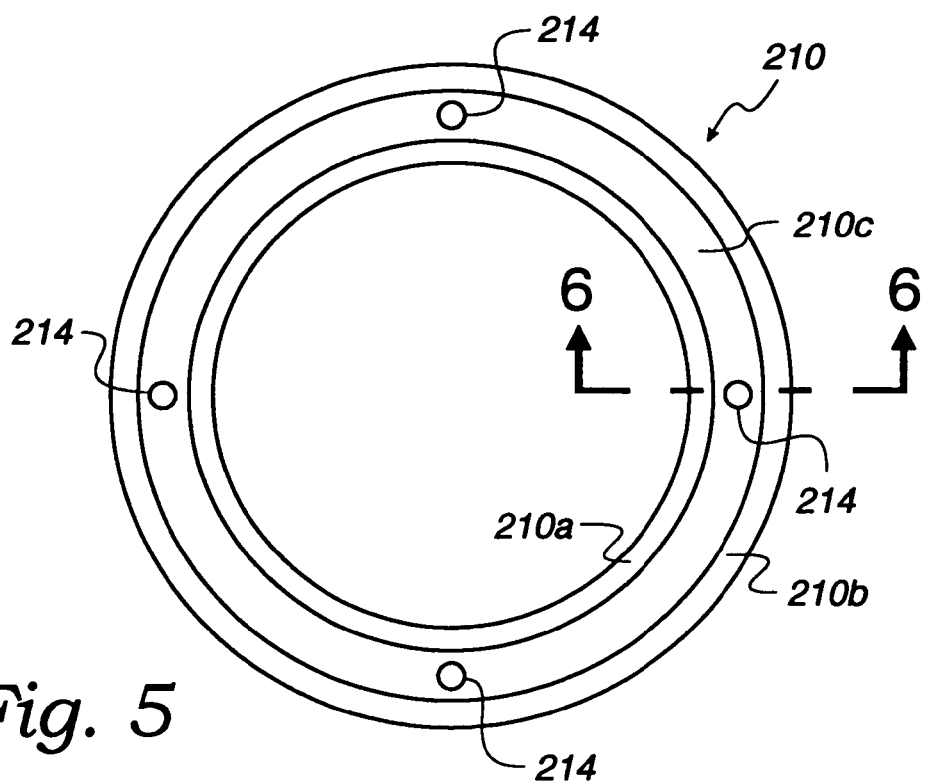
FIG. 5 is a top view of an annular catch basin in accordance with one embodiment of the invention.

FIG. 5 is a top view of an annular catch basin in accordance with one embodiment of the invention. Annular catch basin 210 includes inner wall 210a and outer wall 210b. Inner wall 210a and outer wall 210b extend from floor 210c. Drain openings 214 are defined within floor 210c. Thus, fluid collected in the collection region defined between inner wall 210a, outer wall 210b and floor 210c drains from the catch basin through drain openings 214. In one embodiment, a top surface of floor 210c may be sloped in order to direct fluid to a respective drain opening 214. It should be appreciated that the illustration of four drain openings 214 shown evenly distributed through annular catch basin 210 is not meant to be limiting. That is, any suitable number of drain openings 214 having any suitable shape may be defined through floor 210c. As mentioned with reference to FIG. 3, catch basin 210 remains stationary while annular manifold 208, which is disposed over the catch basin, rotates. Catch basin 210 may be supported through support legs anchored to the floor of a chamber housing and the catch basin as shown with reference to FIG. 10.

Figure 6:
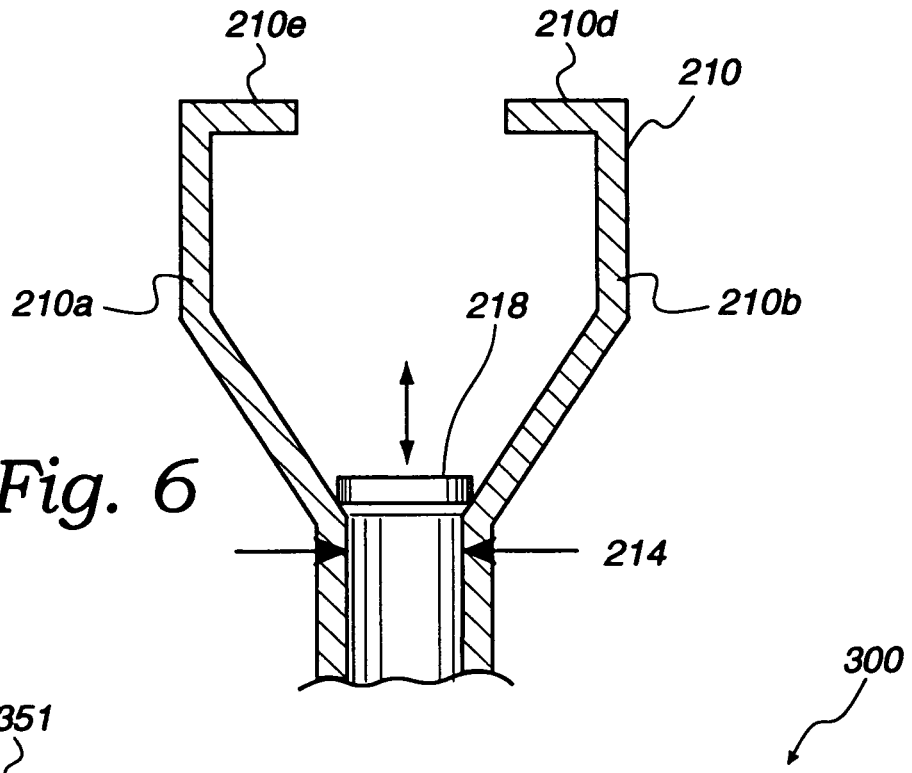
FIG. 6 is a cross-sectional view of an alternative embodiment of the catch basin of FIG. 5 in accordance with one embodiment of the invention.

FIG. 6 is a cross-sectional view of an alternative embodiment of the catch basin of FIG. 5 in accordance with one embodiment of the invention. Inner wall 210a and outer wall 210b of catch basin 210 include top extensions 210d and 210e, respectively, extending inward toward each other. It should be appreciated that top extensions 210d and 210e act as splash guards to substantially prevent fluid received by catch basin 210 from exiting the catch basin. With reference to FIG. 3, fluid delivered from openings 220 to catch basin 210, may splash as the fluid hits the walls of the catch basin. However, top extensions 210d and 210e are included to contain the splashing in one embodiment of the invention. While top extensions 210d and 210e are shown in FIG. 6, the top extensions are not required as shown with reference to FIG. 5. Furthermore, splash containment may be achieved through various enhancements, e.g., the inner wall 210a and outer wall 210b may be rounded in a convex manner to minimize splashing.

Still referring to FIG. 6, plug 218 opens and closes access to drain opening 214 by traveling in a vertical direction. Thus, in a closed position plug 218 creates a seal with inner wall 210a, outer wall 210b and floor 210c. It will be apparent to one skilled in the art that plug 218 can be composed of any material which is compatible with the process fluids. Furthermore, the shape of plug 218 may be any suitable shape enabling the plug to seal or unseal drain opening 214 as the plug travels in a vertical direction. Any number of mechanisms known in the art may provide the force necessary to cause plug 218 to travel in a substantially vertical direction. For example, a servomotor may be used to control the movement of plug 218. Alternatively, pneumatic controls may actuate the travel of plug 218.

Figure 7:
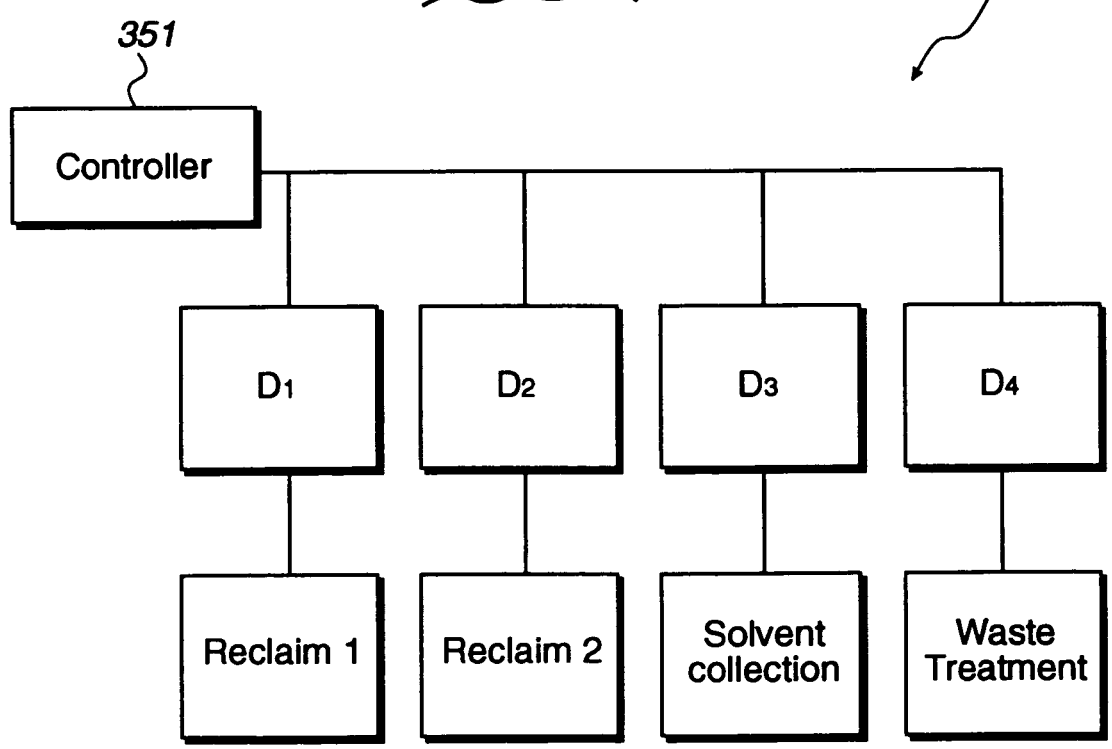
FIG. 7 is a simplified block diagram illustrating the relationship between drains of a catch basin and collection tanks in accordance with one embodiment of the invention.

FIG. 7 is a simplified block diagram illustrating the relationship between drains of a catch basin and collection tanks in accordance with one embodiment of the invention. The boxes labeled $D_1$, $D_2$, $D_3$, and $D_4$ represent the drain openings of a catch basin, such as catch basin 210 with reference to FIGS. 3 and 4. Here, a configuration of a catch basin having four drains is provided for illustrative purposes only. Each drain provides a dedicated connection to a separate collection tank. Drain $D_1$ and $D_2$ are in flow communication with reclaim collection tanks 1 and 2, respectively. Drain $D_3$ is in flow communication with solvent collection tank 3 and drain $D_4$ is in flow communication a waste treatment collection tank. Thus, during operation of the fluid collection process, the drain allowing access to a connection between one or more of the targeted collection tanks is opened, while the drain for the non-targeted collection tanks and associated lines remains closed. With reference to FIG. 3, the one or more of plugs 218 open to provide access between catch basin 210 and the corresponding collection tank. It will be apparent to one skilled in the art that the control of the drains may be automated through controller 351. For example, controller 351 may provide control signals for opening or closing the plugs for each corresponding drain depending on a recipe being executed in the cleaning chamber. Furthermore, where a solvent is being used in the process, a particular drain may be dedicated to solvent collection. One skilled in the art will appreciate that an interlock mechanism may be used to prevent access to any drain openings besides the drain opening designated for solvents.

Accordingly, as a wafer is being cleaned or rinsed, the fluid captured from the wafer surface through the annular manifold is directed to the catch basin as illustrated with reference to FIGS. 2 and 3. Depending on the chemical properties of the fluid, any one of the drains, or any combination of the openings of the catch basin may be unsealed so that the fluid is collected into one or more targeted collection tanks. For example, returning to FIG. 7, if the fluid is environmentally hazardous and can not be recycled, the fluid can be directed to waste treatment or solvent collection by unsealing opening $D_4$, while leaving openings $D_1$-$D_3$ sealed. One skilled in the art will appreciate that further assurance against any cross contamination between a later used recyclable fluid and the previously used hazardous fluid is gained by maintaining drain opening $D_4$ sealed and unsealing any of drain openings $D_1$-$D_3$. That is, the collection lines and collection tanks downstream of drain openings $D_1$-$D_3$ are not exposed to the hazardous material, thereby minimizing any opportunity for cross contamination.

Figure 8:
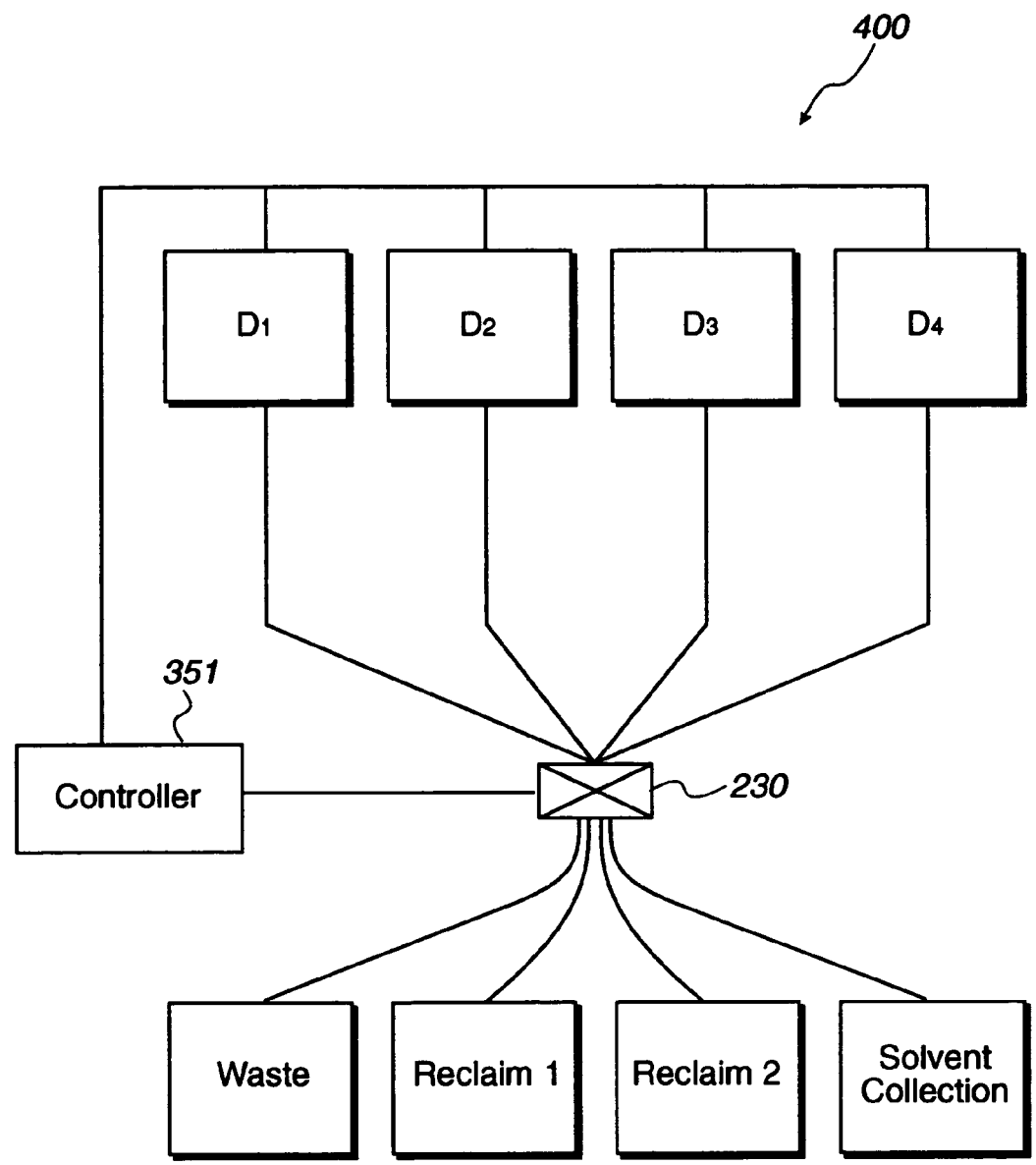
FIG. 8 is a simplified block diagram illustrating an alternative relationship to FIG. 7 between drains of a catch basin and respective collection tanks.

FIG. 8 is a simplified block diagram illustrating an alternative relationship to FIG. 7 between drains of a catch basin and respective collection tanks. Similar to FIG. 7, the boxes labeled $D_1$, $D_2$, $D_3$, and $D_4$ of FIG. 8 represent the drain openings of a catch basin such as the drain openings 214 with reference to FIGS. 2, 4 and 10. In one embodiment, a catch basin with four openings ($D_1$, $D_2$, $D_3$, and $D_4$) may have the fluid delivered from the four drains all routed to a common point. For example, the openings may be in flow communication with a common manifold and the common manifold may be configured to deliver fluid to any number of collection tanks. FIG. 8 illustrates four possible collection destinations from a common manifold. The four destinations shown include two reclaim collection tanks, a solvent collection tank and a waste treatment collection tank. In one embodiment, during operation of the fluid collection process, valve 230, located downstream from a common manifold, is set to direct the fluid to a targeted collection tank. For example, the valve may be a two-way, three-way, four-way, etc., valve, allowing access to any suitable number of targeted collection tanks.

Still referring to FIG. 8, controller 351 supplies control signals for the drain valves associated with drain openings $D_1$-$D_4$. Additionally controller 351 supplies control signals to valve 230. Thus, any of the effluent streams from drain openings $D_1$-$D_4$ may be directed to any of the collection tanks. As mentioned above, the control signals may be incorporated into a recipe for the process being performed in the cleaning chamber. In one embodiment, controller 351 is a general purpose computer. Further permutations of drain opening and collection tank combinations may be used as demanded by the process. It should be appreciated that the configurations of four drain openings and four collection tanks, used with reference to FIGS. 7 and 8, are provided for exemplary purposes only and are not meant to be limiting as any suitable number of drain openings and collection tanks may be used.

In one particular application for the embodiments described herein, sensors may be placed downstream of the openings defined in the catch basin to assist in the detection of a rinsing cycle endpoint. For example, for a cleaning cycle utilizing an acidic fluid, such as hydrogen fluoride (HF), a signal from a pH sensor placed so as to detect the pH of the waste stream may be used to trigger an endpoint of one cycle and/or the initiation of another. Here, the sensor may be in communication with the controller mentioned with reference to FIGS. 7 and 8. Rather than rinse the wafer and the downstream flow path with a large volume of rinsing agent, the pH sensor in the path of an effluent stream enables the system to more efficiently switch processes when rinsing is measured as complete according to the pH value (typically neutral). For example, after a first cleaning chemistry is applied to the wafer, a rinse may or may not be performed prior to the application of a second cleaning chemistry. However, if it is desired to recycle the second cleaning chemistry, the first cleaning chemistry or the rinsing agent must be flushed in order not to dilute or change the chemical composition of the second cleaning chemistry if the second cleaning chemistry is to be recycled. One skilled in the art will appreciate that alteration of the compositions of cleaning chemistries for single wafer cleaning processes impacts the performance of the chemistry. Thus, as a result of the small surface area of the configuration described herein, the amount of flush required to obtain an essentially pure level of the second cleaning chemistry is minimized. Accordingly, the waste of the second cleaning chemistry is minimized. Of course, a sensor configured to detect a property, such as pH may be used to indicate a starting point for recycling, i.e., reclaiming, to begin. In one embodiment, the sensor is located so that a steady stream of effluent causes the sensor to be submerged in order to avoid the possibility of bubbles and air interfering with the sensor. In another embodiment, multiple sensors may be located at various positions downstream of the drain openings defined in the catch basin. Moreover, while pH sensors are described here, any suitable sensors capable of detecting a desired characteristic of the effluent, e.g., temperature, flow rate, conductivity, etc., may be utilized as described above.

Figure 9:
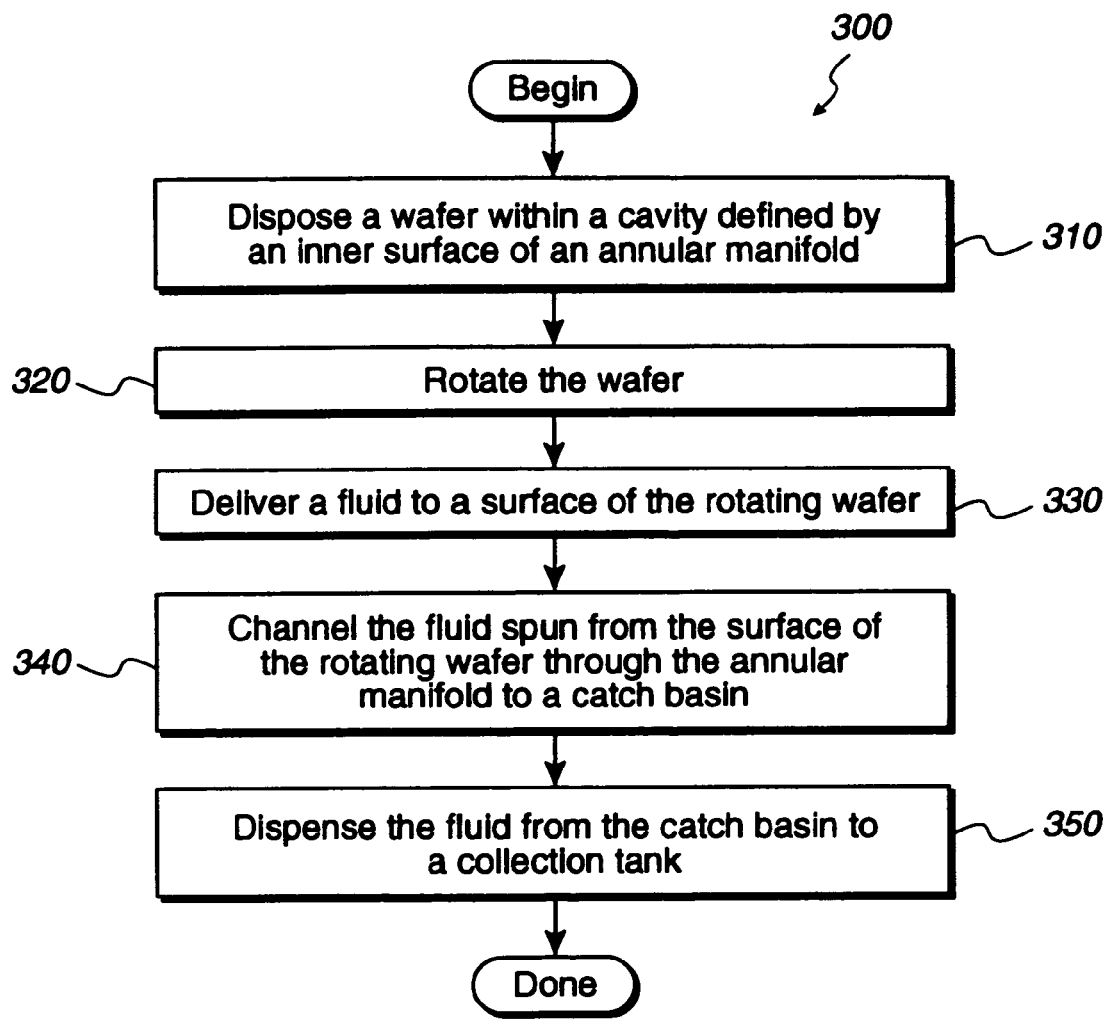
FIG. 9 is a flow chart diagram illustrating the method operations performed to collect a fluid delivered to a surface of a wafer in accordance with one embodiment of the invention.

FIG. 9 is a flow chart diagram 300 illustrating the method operations performed to collect a fluid delivered to a surface of a wafer in accordance with one embodiment of the invention. The method initiates with operation 310, in which a wafer is disposed within a cavity defined by an inner surface of an annular manifold. Here, the wafer may be placed in the inner cavity through the employment of known robotic based placement techniques. In one embodiment, the wafer is coupled to the annular manifold through the use of clamps or other suitable support mechanisms. The method then advances to operation 320 where the wafer rotates. As described above with reference to FIGS. 2 and 3, the wafer and the annular manifold are coupled to each other through a support, e.g., a clamp, support pads, etc., holding the wafer in the inner cavity of the annular manifold. Thus, the wafer rotates as the annular manifold rotates. The drive mechanisms for rotating the wafer include a belt drive as discussed with reference to FIGS. 4 and 10.

The method of FIG. 9 then proceeds to operation 330. In operation 330, the fluid is delivered to a surface of the rotating wafer. Known techniques for applying the fluid to the top and/or bottom surface of the wafer may be used here. In one embodiment, the fluid is sprayed onto the surface of the wafer in a fan pattern. It should be appreciated that a first fluid may be delivered to a top surface of the wafer, while a second fluid is delivered to a bottom surface of the wafer simultaneously as described above. Alternatively, divergent chemistries, i.e., chemistries having different chemical compositions, may be applied sequentially in order to recycle one or both of the chemistries as described herein. The method then moves to operation 340 where the fluid spun from the surface of the rotating wafer is channeled through the annular manifold to a catch basin. Here, the fluid applied to the surface of the wafer is essentially spun-off of the wafer surface through the centrifugal force caused by the rotation of the wafer, as described with reference to FIG. 3. The channel is defined over the entire perimeter of the inner edge of the annular manifold and the channel is proximate to the outer edge of the wafer. Thus, the liquid dispersed from the surface of the wafer is captured by the channel rather than splashing onto inner surfaces of the chamber housing. The fluid collected by the annular manifold is channeled to a catch basin disposed below the annular manifold. In one embodiment, the catch basin is a stationary annular tub disposed below the annular manifold as described with reference to FIGS. 3, 5, and 6. Here, the fluid captured by the channel is directed down the channel to the catch basin due to the rotation of the annular manifold. As described above, the channel has at least one opening defined through a base of the annular manifold enabling the fluid to be delivered to the catch basin. Of course, the opening on the bottom surface of the annular manifold may take on numerous suitable configurations depending on the flow rates to be accommodated.

Still referring to FIG. 9, the method advances to operation 350 where the fluid is dispensed from the catch basin to a collection tank. The catch basin, such as the catch basin described above with reference to FIGS. 5 and 6, includes a drain opening defined through the floor of the catch basin. Thus, as fluid in the catch basin is collected, the fluid is dispensed through at least one drain opening in the catch basin. Of course, multiple drain openings, where each drain opening has access to a single collection tank or multiple collection tanks, may be provided. As discussed above, the drain openings may be controlled through a controller according to a recipe associated with a particular type of processing operation. For example, some cleaning chemistries, such as solvents, may be collected through a first drain opening dedicated to solvents, while other cleaning chemistries are reclaimed through a recycle loop associated with a second drain opening. In one embodiment, the fluid is controllably dispensed from the catch basin to a corresponding collection tank. It should be appreciated that numerous configurations for waste collection, solvent collection or reclaim/recycle streams may be defined as discussed with reference to FIGS. 7 and 8.

Figure 10:
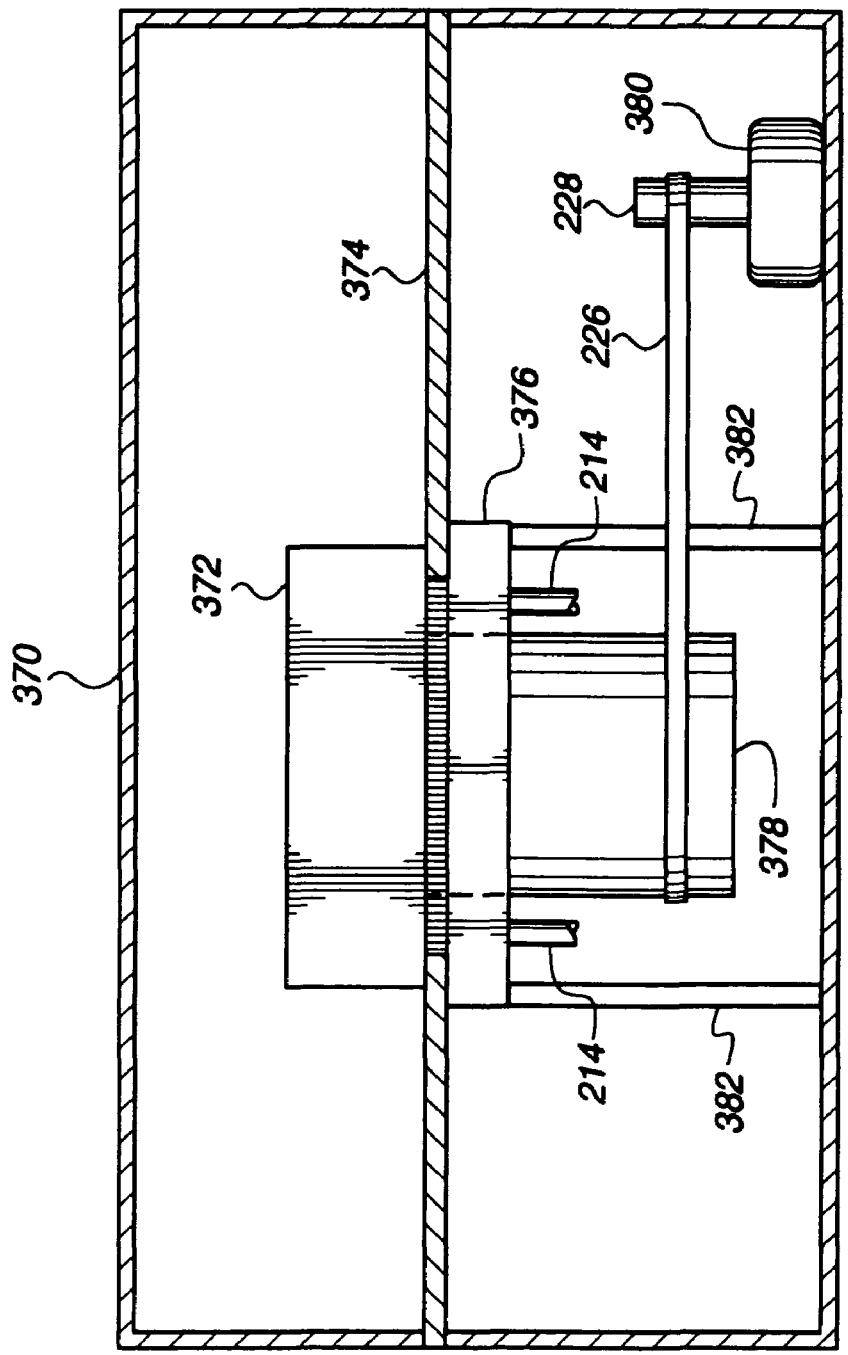
FIG. 10 is a simplified schematic diagram of a spin, rinse and dry module having a fluid collection device in accordance with one embodiment of the invention.

FIG. 10 is a simplified schematic diagram of a spin, rinse and dry module having a fluid collection device in accordance with one embodiment of the invention. Here, the fluid collection device such as the fluid collection device described with reference to FIGS. 2-4 is contained within housings 372 and 376 of spin, rinse and dry module 370. That is, housing 372 of FIG. 10 encapsulates annular manifold 208 of FIGS. 2-4, and housing 376 of FIG. 10 encapsulates catch basin 210 of FIGS. 2-4. Shelf 374 provides support for housing 372 and the annular manifold encapsulated therein. Leg supports 382 provide the support for housing 376 and the catch basin encapsulated therein. Drain openings 214 provide access to collection tanks as described with reference to FIGS. 7 and 8.

Still referring to FIG. 10, the drive mechanism for rotating the annular manifold is a belt drive mechanism as described with reference to FIG. 4, in one embodiment. Here, motor 380 rotates shaft 228, which in turn rotates belt 226. In one embodiment, shaft 228 may include a pulley to rotate belt 226. Belt 226 rotates hollow spindle 378 which provides the rotational force for the annular manifold. In another embodiment, hollow spindle 378 includes a rotating part that rotates the annular manifold and a stationary part that supports the annular manifold. Further details on the belt drive system of FIG. 10 may be found in patent application Ser. No. 10/151,664 filed May 17, 2002 and entitled "APPARATUS AND METHOD FOR SUBSTRATE PREPARATION IMPLEMENTING A SURFACE TENSION REDUCING PROCESS." This application is hereby incorporated by reference. It should be appreciated that for illustrative purposes FIG. 10 is not drawn to scale.

In summary, the present invention provides a design and method for a fluid collection device. The fluid collection device may be used inside a standard spin, rinse and dry module commonly used in semiconductor manufacturing processes. The reduced surface area of the channel of the annular manifold allows for conservation of expensive cleaning chemistries. In addition, divergent chemistries may be applied simultaneously or sequentially to top and bottom surfaces of a wafer being processed. It should be appreciated that since the manifold is rotating during fluid collection when running a cleaning process, centrifugal force assists fluid flow through the manifold into the catch basin. In turn, intermediate rinse steps between chemical applications are enhanced and can accomplish the rinsing function more quickly.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims and equivalents thereof.

What is claimed is:

1. An apparatus for collecting fluid within a wafer cleaning chamber, comprising:

a rotatable annular manifold having a body including an inner surface and a bottom surface, the annular manifold configured to support a wafer within a region inside the inner surface, the annular manifold including a channel extending through the body from the inner surface to the bottom surface, the channel defined to be in fluid communication with at least one opening in the bottom surface; and a catch basin having a base with at least one drain defined therein, the base having an inner sidewall and an outer sidewall extending therefrom, the catch basin being disposed under the annular manifold so as to capture fluid dispensed from the at least one opening of the bottom surface of the annular manifold.

2. The apparatus of claim 1, wherein each of the inner sidewall and the outer sidewall of the catch basin includes a top extension for retaining splashed fluid within the catch basin.

3. The apparatus of claim 1, wherein the rotatable annular manifold and the catch basin are configured to enable access to a top surface and a bottom surface of the wafer to be supported within the region inside the inner surface of the annular manifold.

4. The apparatus of claim 1, wherein the catch basin is stationary.

5. The apparatus of claim 1, wherein the annular manifold includes clamps configured to support the wafer within the region inside the inner surface of the annular manifold.

6. The apparatus of claim 1, wherein the at least one opening defined in the bottom surface of the annular manifold is selected from the group consisting of a nozzle and a slot.

7. A spin, rinse and dry module, comprising:

an annular manifold having a body including an inner surface and a bottom surface, the annular manifold defined to rotate a wafer disposed within a region inside the inner surface, the annular manifold having a channel defined through the body from the inner surface to the bottom surface, an opening of the channel at the inner surface configured to receive a fluid to be dispersed from a surface of the rotating wafer;

a catch basin disposed under the annular manifold, the catch basin being configured to receive the fluid from an opening of the channel at the bottom surface of the annular manifold; and a drive mechanism for rotating the annular manifold.

8. The spin, rinse and dry module of claim 7, wherein the catch basin includes at least one catch basin drain, each of the at least one catch basin drain being in flow communication with a collection tank.

9. The spin, rinse and dry module of claim 7, further comprising:

a controller configured to select at least one catch basin drain to dispense the fluid to a collection tank in flow communication with the at least one catch basin drain.

10. The spin, rinse and dry module of claim 9, further comprising:

a sensor configured to monitor a property of the fluid being dispensed to the collection tank, the sensor being in communication with the controller.

11. The spin, rinse and dry module of claim 7, wherein the drive mechanism is one of a belt drive and a magnetic bearing drive.

12. A method for collecting a fluid delivered to a surface of a rotating wafer, comprising:

disposing a wafer within a region defined inside an inner surface of an annular manifold such that the wafer is coupled to the annular manifold, wherein the annular manifold includes a body defined by the inner surface and a bottom surface, the annular manifold including a channel defined through the body from the inner surface to the bottom surface;

rotating the annular manifold together with the wafer coupled to the annular manifold;

delivering a fluid to a surface of the rotating wafer;

collecting the fluid spun from the surface of the rotating wafer through an opening of the channel at the inner surface of the annular manifold such that the collected fluid is directed through an opening of the channel at the bottom surface of the annular manifold to a catch basin; and dispensing the fluid from the catch basin to a collection tank.

13. The method of claim 12, wherein the operation of disposing the wafer within the region defined inside the inner surface of the annular manifold includes coupling the wafer to a number of clamps attached to the inner surface of the annular manifold.

14. The method of claim 12, wherein the fluid is delivered to a top surface of the rotating wafer.

15. The method of claim 12, wherein the collection tank is selected from the group consisting of a reclaim tank, a waste tank, and a solvent tank.

16. A method for collecting fluids delivered to a surface of a rotating wafer, comprising:

disposing a wafer within a region defined inside an inner surface of an annular manifold such that the wafer is coupled to the annular manifold, wherein the annular manifold includes a body defined by the inner surface and a bottom surface, the annular manifold including a channel defined through the body from the inner surface to the bottom surface;

rotating the annular manifold together with the wafer coupled to the annular manifold;

delivering a first fluid to a surface of the rotating wafer;

collecting the first fluid spun from the surface of the rotating wafer through an opening of the channel at the inner surface of the annular manifold such that the collected fluid is directed through an opening of the channel at the bottom surface of the annular manifold to a catch basin;

controllably dispensing the first fluid from the catch basin to a first collection tank;

delivering a second fluid to a surface of the rotating wafer;

collecting the second fluid spun from the surface of the rotating wafer through the opening of the channel at the inner surface of the annular manifold such that the collected second fluid is directed through the opening of the channel at the bottom surface of the annular manifold to the catch basin; and controllably dispensing the second fluid from the catch basin to a second collection tank.

17. The method of claim 16, wherein the operation of disposing the wafer within the region defined inside the inner surface of the annular manifold includes coupling the wafer to a number of clamps attached to the inner surface of the annular manifold.

18. The method of claim 16, wherein the first fluid is delivered to a top surface of the rotating wafer, and the second fluid is delivered to the top surface of the rotating wafer.

19. The method of claim 16, wherein the first fluid is delivered to a top surface of the rotating wafer, and the second fluid is delivered to a bottom surface of the rotating wafer.

20. The method of claim 16, wherein the first collection tank is a reclaim tank and the second collection tank is one of a solvent tank and a waste tank.

21. The method of claim 16, wherein the first collection tank is a solvent tank and the second collection tank is one of a reclaim tank and a waste tank.

22. The method of claim 16, wherein the first collection tank is a waste tank and the second collection tank is one of a reclaim tank and a solvent tank.

23. The method of claim 16, wherein the operation of controllably dispensing the first fluid from the catch basin to the first collection tank and the operation of controllably dispensing the second fluid from the catch basin to the second collection tank comprise:

selectively controlling drain plugs that open and close drain openings formed in the catch basin.

24. The method of claim 16, wherein the operation of controllably dispensing the first fluid from the catch basin to the first collection tank comprises:

channeling the first fluid from the catch basin to a manifold having a multi-directional valve; and controlling the multi-directional valve to channel the first fluid to the first collection tank.

25. The method of claim 24, wherein the operation of controllably dispensing the second fluid from the catch basin to the second collection tank comprises:

channeling the second fluid from the catch basin to the manifold having the multi-directional valve; and controlling the multi-directional valve to channel the second fluid to the second collection tank.

* * * * *